United States Patent [19]

Arakawa

[11] Patent Number: 4,825,273
[45] Date of Patent: Apr. 25, 1989

[54] SEMICONDUCTOR INTEGRATED CIRCUIT DEVICE

[75] Inventor: Takahiko Arakawa, Hyogo, Japan

[73] Assignee: Mitsubishi Denki Kabushiki Kaisha, Tokyo, Japan

[21] Appl. No.: 24,010

[22] Filed: Mar. 10, 1987

[30] Foreign Application Priority Data

May 23, 1986 [JP] Japan .................. 61-119758

[51] Int. Cl.4 ............................. H01L 27/02
[52] U.S. Cl. ........................ 357/42; 357/45; 357/68
[58] Field of Search ............. 357/42, 45 M; 352/42, 352/45, 68

[56] References Cited

U.S. PATENT DOCUMENTS 4,611,236 9/1986 Sato ..................... 357/42 X

FOREIGN PATENT DOCUMENTS

| 0131464 | 1/1985 | European Pat. Off. . |
| 0136880 | 4/1985 | European Pat. Off. . |
| 0177336 | 4/1986 | European Pat. Off. . |
| 53-20876 | 2/1978 | Japan .................. 357/42 |
| 57-154869 | 9/1982 | Japan .................. 357/42 |
| 74647 | of 1985 | Japan . |
| 85/02062 | 5/1985 | World Int. Prop. O. . |

Primary Examiner—Andrew J. James
Assistant Examiner—Sara W. Crane
Attorney, Agent, or Firm—Wolf, Greenfield & Sacks

[57] ABSTRACT

A basic cell for semiconductor integrated circuit devices comprises at least one MOS transistor of a first type of electric conduction and at least one MOS transistor of a second type of electric conduction. On both sides of the source/drain region of the MOS transistor of the first type, diffusion contact regions of the second type of electric conduction are disposed, and, on both sides of the source/drain region of the MOS transistor of the second type, diffusion contact regions of the first type of electric conduction are disposed. In the respective MOS transistors, gate electrode contact regions are provided on either side of the diffusion contact regions. These MOS transistors are symmetrical with respect to the transverse axis running through the center of the respective source/drain regions. Disclosure is also made of a semiconductor integrated circuit device of the master slice type including a plurality of such basic cells arranged at regular intervals.

12 Claims, 5 Drawing Sheets

SEMICONDUCTOR INTEGRATED CIRCUIT DEVICE

BACKGROUND OF THE INVENTION

1. Technical Field

The present invention relates to a semiconductor integrated circuit device, and, in particular, to a CMOS master-slice-type semiconductor integrated circuit device capable of extending the degree of design freedom available, thereby bringing about the advantages of higher integration and efficiency and of further improvement of the tolerance with respect to the latch-up phenomenon.

2. Prior Art

FIG. 1 shows a conventional basic cell as disclosed in Japanese Patent Public Disclosure No. 74647/85. In this figure, basic cell 100 comprises two gate electrodes 101, p+-type source/drain regions 102, n+-type contact diffusion regions of the substrate 103, p+-type contact diffusion regions of the p-well 104 and n+-type source/drain regions 105. Thus, a p-type MOS transistor 106 and an n-type MOS transistor 107 are formed.

In such a basic cell, n+-type contact diffusion regions of the substrate 103 and p+-type contact diffusion regions of the p-well 104 are disposed between a pair of transistors consisting of p-type MOS transistor 106 and n-type MOS transistor 107. The purpose of this is to heighten the substrate potential and the well potential, and to improve the tolerance with respect to the latch-up phenomenon which occurs between p-type MOS transistor 106 and n-type MOS transistor 107. By interconnecting the gate electrodes of p-type transistor 106 and the gate electrodes of n-type transistor 107, the size of basic cell 100 can be reduced and the degree of integration can be improved.

Accordingly, in a gate array in which such basic cells are arranged regularly so as to form a plurality of rows of basic cells, if a sufficient distance is maintained between the adjacent rows, no particular problem is caused so long as the respective basic cells include n+-type contact diffusion regions 103 and p+-type contact diffusion regions 104 disposed between MOS transistors 106 and 107 of a different conductivity type.

Consideration should now be given to gate arrays having a plurality of rows of basic cells disposed at shorter intervals from each other and structured as described above. Some examples of such gate arrays are a gate array having narrow wiring regions and a small number of gates, and a gate array having the rows of basic cells arranged in close proximity to each other (hereinafter, called "a pavement-type gate array"). In the adjacent two rows of basic cells in such gate arrays, the contact diffusion regions of the substrate and the contact diffused regions of the p-well are not provided between the p-type MOS transistors in one of the rows of basic cells and the n-type MOS transistors in the other row of basic cells, that is, in the CMOS structure formed by these two different type transistors, and this leads to the possibility of the latch-up phenomenon occurring in the regions of the CMOS structure. The pavement-type gate arrays also involve the problem of necessitating variations in the wiring channel regions in accordance with the length of the longer side of one basic cell.

SUMMARY OF THE INVENTION

Accordingly, an object of the invention is to solve such problems as described above.

A further object of the invention is to provide a basic cell structured such as to be suitable for a semiconductor integrated circuit device free from the problems described above.

Another object of the invention is to provide a semiconductor integrated circuit device in which the wiring channel regions are finely changeable, thereby improving the integration and the tolerance with respect to the latch-up phenomenon.

To achieve these objects, the basic cell according to the present invention includes diffusion contact regions (i.e., diffusion collar band regions) disposed on both sides of the source/drain region of each MOS transistor in the basic cell. Each of the diffusion contact regions is of the conductivity type opposite to that of the corresponding source/drain region. On both sides of each of the diffusion collar band regions, contact regions for the gate electrode of each MOS transistor are provided. In a preferred embodiment, the shape of the respective MOS transistors in each basic cell is chosen to be symmetrical with respect to the transverse axis running through the center point of the source/drain region of each MOS transistor.

The semiconductor integrated circuit device according to the present invention includes a plurality of basic cells of the kind just described. In a preferred embodiment, the first-conductivity-type MOS transistor and the second-conductivity-type MOS transistor are respectively symmetrical with respect to the transverse axis running through the center point of the source/drain region of each transistor. The plurality of basic cells are preferably arranged regularly such as to form a plurality of basic cells.

In the present invention, since the diffusion collar band regions are provided on both sides of the source/drain region of each MOS transistor, it is possible to prevent the latch-up phenomenon from occurring between the transistors of the adjacent rows of basic cells, although the distance between the adjacent rows of basic cells is short as in the case of the pavement-type gate arrows. The contact regions for the gate electrode of each MOS transistor are disposed on both sides of each of the diffusion color band regions, which enables connections between each contact region and the gate electrode, thereby reducing the number of wiring lines. In the case where the shape of the respective MOS transistors is formed symmetrical with respect to the transverse axis running through the center point of the source/drain region of each transistor, the minimum number of wiring tracks is equal to the dimension of the wiring pitch which is determined by the length of the longer side of each MOS transistor, thereby enabling the number of wiring tracks to be finely changed.

BRIEF DESCRIPTION OF THE DRAWINGS

Other features, objects and advantages of the invention will be more apparent from the following description taken in conjunction with the accompanying drawings wherein.

DESCRIPTION OF THE PREFERRED EMBODIMENTS

The preferred embodiments of this invention will be explained with reference to FIGS. 2-5.

Figure 2:
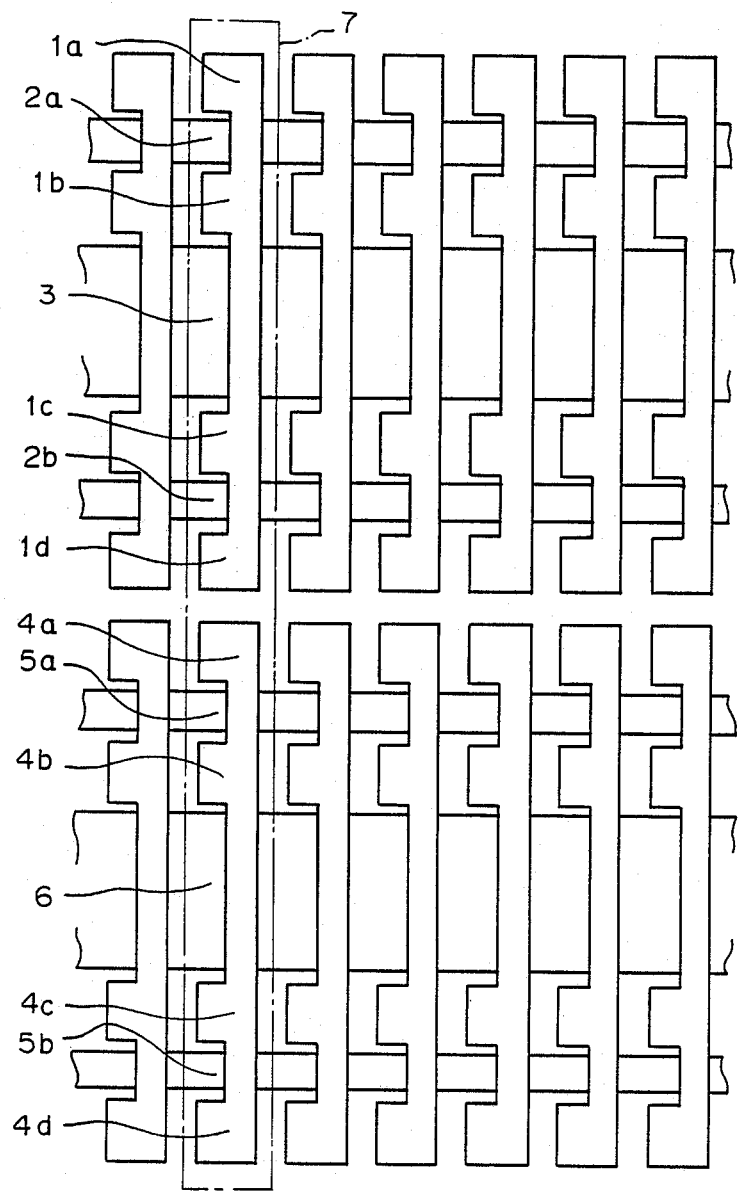
FIG. 2 is a diagrammatical view of the structure of a basic cell according to an embodiment of the invention.

FIG. 2 shows a diagrammatical view of the structure of a basic cell according to the present invention. In this figure, basic cell 7 comprises a p-type MOS transistor and an n-type MOS transistor. The p-type MOS transistor includes gate contact regions 1a, 1b, 1c and 1d. Gate contact regions 1a and 1b are respectively disposed at each side of n+-type diffusion collar band region (i.e. n+-type diffusion contact region) 2a, and gate contact regions 1c and 1d are respectively disposed at each side of N+-type diffusion collar band region 2b. Two sets of a pair of gate contact regions and one n+-type diffusion collar band region 1a, 1b, 2a; 1c, 1d, 2b are arranged such that p+-type source/drain region 3 is disposed between these two sets and that these two sets are symmetrical with respect to the transverse axis running through the center point of p+-type source/drain region 3. More specifically, the pair of gate contact regions 1a and 1b and the pair of gate contact regions 1c and 1d, as well as diffusion collar band regions 2a and 2b, are symmetrical with each other with respect to the transverse axis running through the center point of p+-type source/drain region 3.

The structure of the n-type MOS transistor in basic cell 7 is similar to that of the p-type MOS transistor, except for the difference in conduction type. Gate contact regions 4a and 4b are respectively disposed at each side of p+-type diffusion collar band region (i.e. p+-type diffusion contact region) 5a, and gate contact regions 4c and 4d are respectively disposed at each side of p+-type diffusion collar band region 5b. Two sets of a pair of gate contact regions and one p+-type diffusion collar band region 4a, 4b, 5a; 4c, 4d, 5b are arranged such that n+-type source/drain region 6 is disposed between these two sets and that these two sets are symmetrical with respect to the transverse axis running through the center point of n+-type source/drain region 6.

Figure 3:
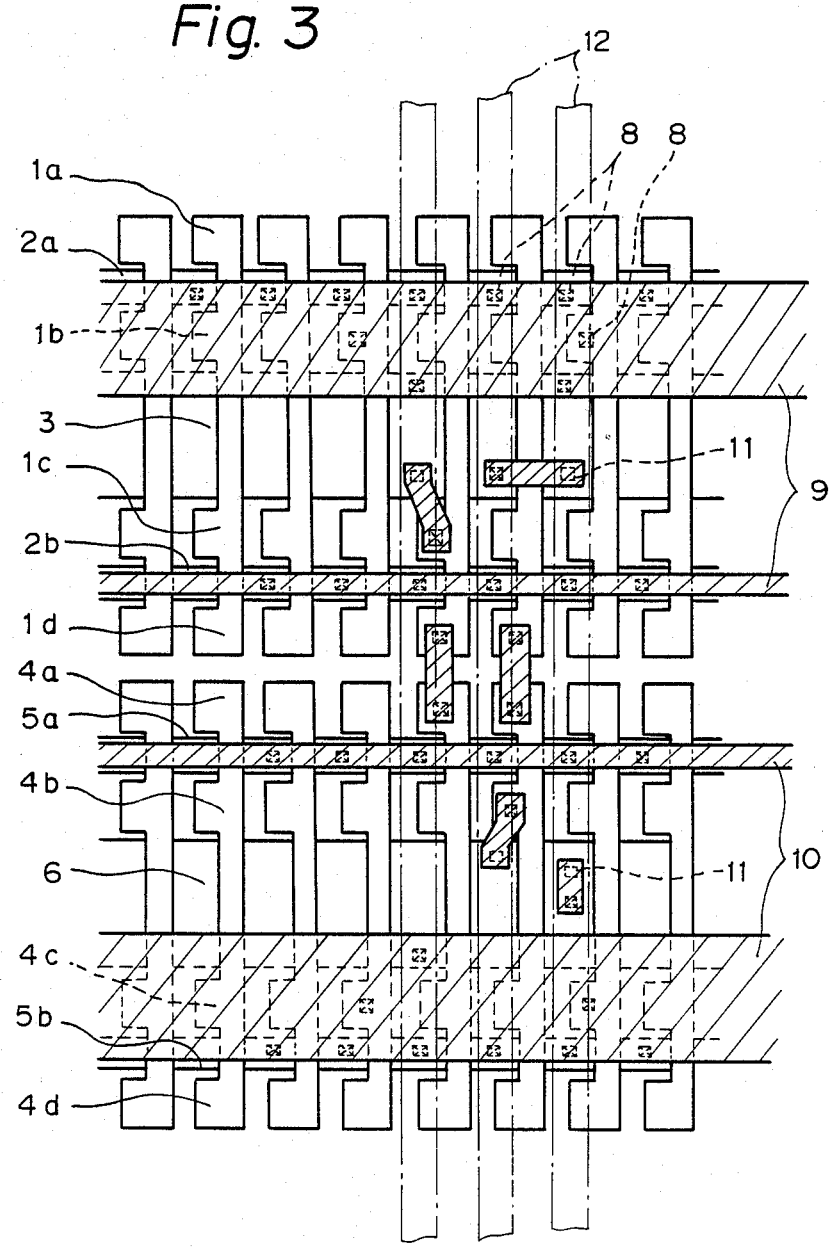
FIG. 3 is a diagrammatical view of the structure of a two-input NAND gate cell using the basic cells of this invention.

FIG. 3 shows diagrammatically the structure of a two-input NAND gate cell using the basic cells shown in FIG. 2. In this figure, the same reference numerals designate like parts. The reference numeral 8 designates each contact, the numeral 9 the source voltage ($V_{DD}$) supply lines formed by the first aluminium wiring layer, the numeral 10 the ground lines formed by the first aluminium wiring layer, and the numeral 11 throughholes for connecting the first aluminium wiring layers 9 with the second aluminium wiring layers (signal lines) 12.

Figure 4:
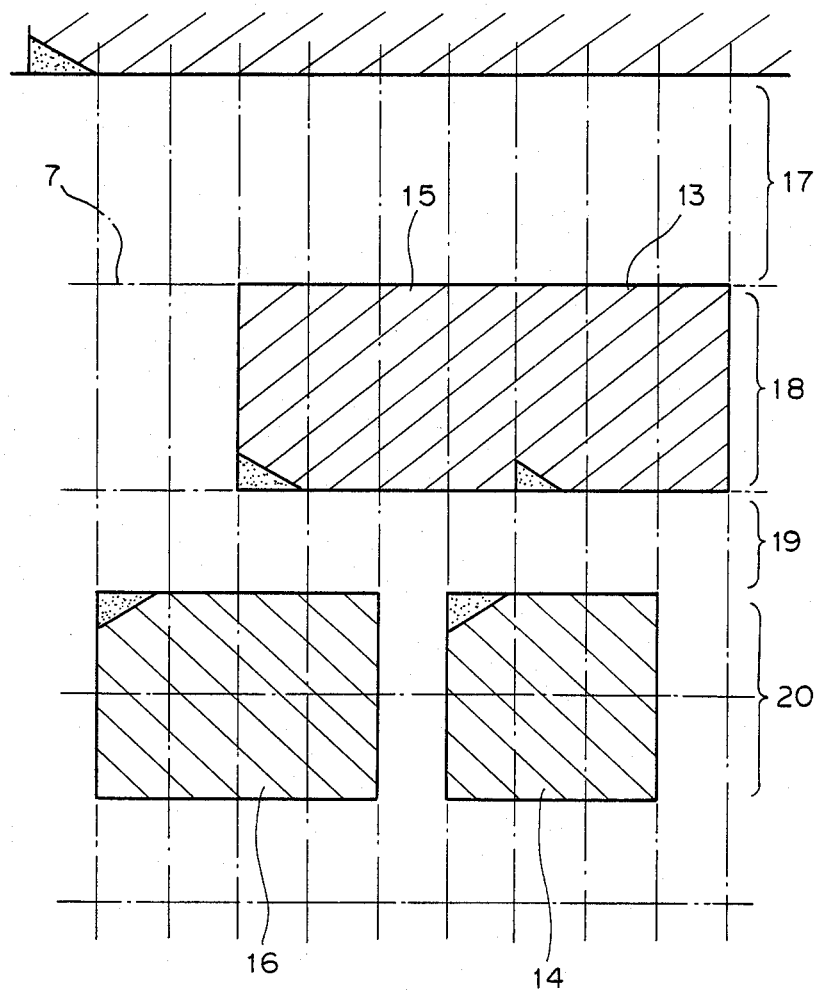
FIG. 4 shows the disposition of macrocells in the case of a gate array having closely arranged basic cells of this invention.

FIG. 4 shows a diagrammatical view of the arrangement of macrocells in a gate array (the pavement-type gate array) having the closely arranged basic cells according to the present invention. In this figure, the reference numeral 13 designates a macrocell, for example, the two-input NAND gate cell as shown in FIG. 3.

Another macrocell 15 is disposed just adjacent to macrocell 13. Macrocells 13 and 15 are arranged in the first area 18 of the first row of basic cells.

The gate array also includes macrocells 14 and 16 which are respectively the complete reverse to macrocells 13 and 15 with respect to the direction of the row of basic cells. Macrocells 14 and 16 are arranged in the second area 20 of the second row of basic cells. The reference numerals 17 and 19 designate wiring bands.

The operation of one embodiment according to the present invention will now be explained.

Figure 1:
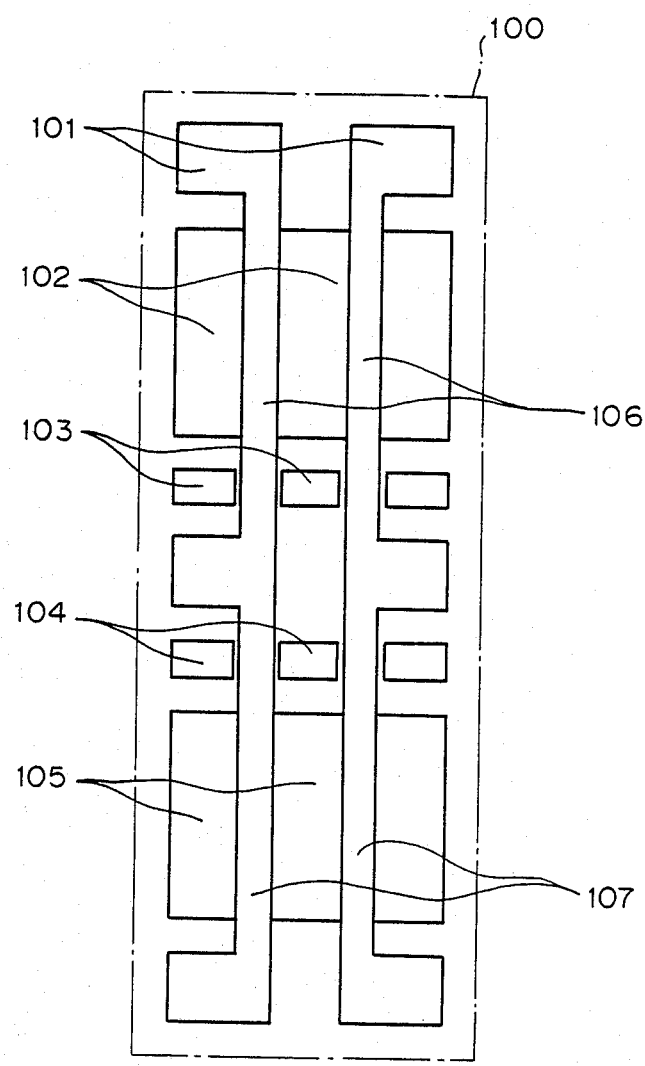
FIG. 1 shows diagrammatically the structure of a basic cell of the prior art.

As already described with reference to FIG. 1, the tolerance with respect to the latch-up in a CMOS circuit including p-type MOS transistors and n-type MOS transistors can be improved by providing the contact diffusion regions of the substrate 103 and the contact diffusion regions of the p-well 104 between p-type and n-type MOS transistors. In a case, however, where such regions are solely provided between the p-type MOS transistor and the n-type MOS transistor in each basic cell of a gate array having a quite short distance between the adjacent rows of basic cells, such as a pavement-type gate array, the latch-up phenomenon may happen between the p-type MOS transistors in one of two adjacent rows of basic cells and the n-type MOS transistors is the other row, that is, between the CMOS circuits comprising these p-type and n-type MOS transistors.

In pavement-type gate arrays, the width of the wiring bands is determined to be equal to a multiple of the width of each row of basic cells. In the case of the prior art basic cells as shown in FIG. 1, the number of wiring lines can be changed merely on the basis of the wiring pitch which is determined by the length of the longer side of the basic cell.

In contrast with the prior art, the p-type MOS transistor and the n-type MOS transistor in the basic cell according to the present invention are formed to provide an arrangement wherein the gate contact regions and the diffusion collar band regions are symmetrical with respect to the transverse axis running through the center point of each source/drain region and in the direction of the row of basic cells. Accordingly, such a basic cell serves to prevent the occurrence of the latch-up phenomenon and enables the number of wiring tracks to be changed finely.

For example, in the case where a two-input NAND gate is formed on one row of basic cells as shown in FIG. 3, the electrical potential of n+-type diffusion collar band regions 2a and 2b disposed on both sides of each p-type MOS transistor is established by power supply lines 9. Similarly, the electrical potential of p+-type diffusion collar band regions 5a and 5b disposed on both sides of each n-type MOS transistor is established by ground lines 10. In addition, n+-type diffusion collar band regions 2a and 2b and p+-type diffusion collar band regions 5a and 5b have a low resistance value, and a very small voltage drop can be seen in these regions. This brings about an improved tolerance with respect to the latch-up phenomenon. Since gate contact regions 1a, 1b, 1c, d, 4a, 4b, 4c and 4d are disposed one by one on either side of diffusion collar band regions 2a, 2b, 5a and 5b, a small amount of the second aluminium lines is used when wiring in the macrocells as shown in FIG. 4. Moreover, the symmetrical shape of the transistors in the basic cell offers the advantage of being able to disposed macrocells 14 and 16 (the complete reversal of macrocells 13 and 15 with respect to the axis in the direction of the row of basic cells) in gate area 20 and remote from gate area 18 (in which macrocells 13 and 15 are disposed) by the dimensional equivalent of the longer side of one MOS transistor. In other words, the width of the wiring track can be set to be equal to a multiple of the length of the longer side of one MOS transistor. In this case, area 19 between areas 18 and 20 is used for a wiring band. By way of example, if the size of the p-type MOS transistors is the same as that of the n-type MOS transistors, the width of the wiring track is changeable at a pitch equivalent to one half of the length of the longer side of the basic cell, enabling an efficient layout in pavement-type gate arrays.

Figure 5:
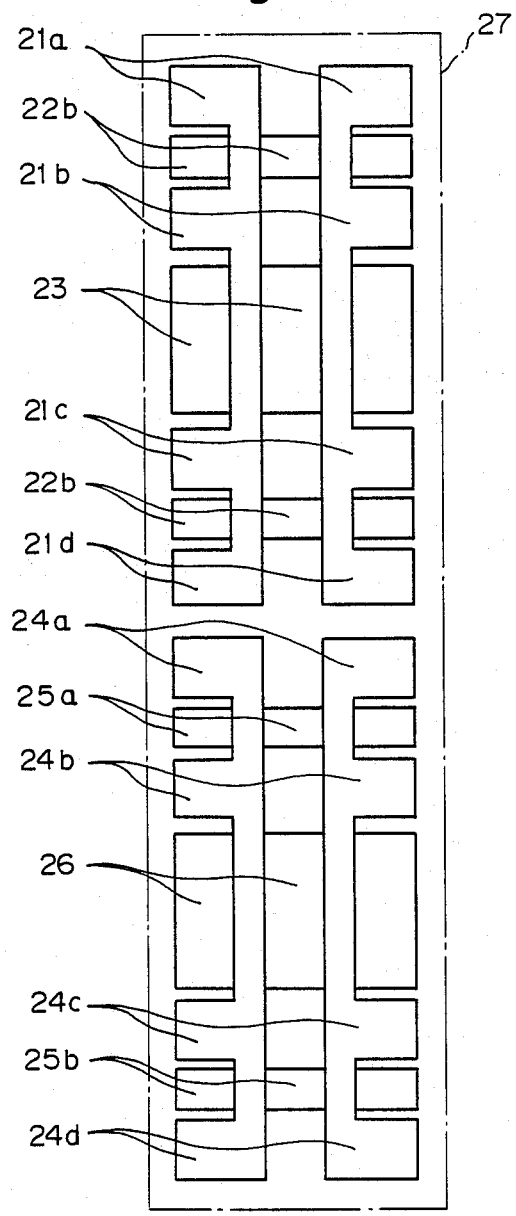
FIG. 5 is a diagrammatical view of the structure of a basic cell according to another embodiment of this invention.

The basic cell as described hitherto comprises a pair of transistors consisting of one p-type MOS transistor and one n-type MOS transistor, but two or more p-type MOS transistors and two or more p-type MOS transistors may be included in a single basic cell. FIG. 5 shows such a type of basic cell as another embodiment of the present invention. In this figure, basic cell 27 includes two p-type MOS transistors and two n-type MOS transistors. The p-type MOS transistors comprise gate contact regions 21a, 21b, 21c and 21d, n+-type diffusion collar band regions 22a and 22b, and p+-type source/drain regions 23. Similarly, the n-type MOS transistors comprise gate contact regions 24a, 24b, 24c and 24d, p+-type diffusion collar band regions 25a and 25b, and n+-type source/drain region 2b. When a plurality of such basic cells are arranged to form a row of basic cells, the basic cells are separated from each other by suitable oxide films.

While the preferred embodiments of the present invention have been described with reference to the accompanying drawings, it is to be understood that a person skilled in the art will well appreciate that changes and modifications may be made therein without departing from the spirit and scope of this invention as defined in the appended claims.

What is claimed is:

1. A basic cell formed on a substrate for constituting semiconductor integrated circuit devices, and comprising at least one first MOS transistor of a first type of electric conduction and at least one second MOS transistor of a second type of electric conduction, each of said MOS transistors having a region for constituting a source or drain and a gate electrode, said basic cell characterized by incorporating, in combination:
    diffusion contact regions of said second type of electric conduction formed on said substrate and disposed on both sides of said region of said first MOS transistor;
    diffusion contact regions of said first type of electric conduction formed on said substrate and disposed on both sides of said region of said second MOS transistor;
    said first MOS transistor gate electrode having gate electrode contact regions disposed on both sides of each of said diffusion contact regions of said second type of electric conduction;
    said first MOS transistor gate electrode contact regions for providing electrical contact with the gate electrode and of a width greater than the width of the gate electrode that bridges each diffusion contact region of second type of electric conduction;
    said second MOS transistor gate electrode having gate electrode contact regions disposed on both sides of each of said diffusion contact regions of said first type of electric conduction;
    said second MOS transistor gate electrode contact regions for providing electrical contact with the gate electrode and of a width greater than the width of the gate electrode that bridges each diffusion contact region of first type of electric conduction.

2. A basic cell as claimed in claim 1 wherein said first and second MOS transistors are respectively symmetrical with respect to the transverse axis running through the center of said region of each said MOS transistor.

3. A basic cell as claimed in claim 2 wherein said first type of electric conduction is a p-type, and said second type of electric conduction is an n-type.

4. A semiconductor integrated circuit device of a master slice type including a plurality of basic cells formed on a substrate at regular intervals, characterized in that each of said basic cells comprises:
    at least one first MOS transistor of a first type of electric conduction having a first region for constituting a source or drain and a first gate electrode;
    at least one second MOS transistor of a second type of electric conduction having a second region for constituting a source or drain and a first gate electrode;
    diffusion contact regions of said second type of electric conduction formed on said substrate and disposed on both sides of said first region of said first MOS transistor;
    diffusion contact regions of said first type of electric conduction formed on said substrate and disposed on both sides of said second region of said second MOS transistor;
    said first gate electrode having contact regions disposed on both sides of said diffusion contact regions of said second type of electric conduction,
    said first gate electrode contact regions for providing electrical contact with the first gate electrode and of a width greater than the width of the first gate electrode that bridges each diffusion contact region of second type of electric conduction;
    said second gate electrode having contact regions disposed on both sides of said diffusion contact regions of said first type of electric conduction;
    said second gate electrode contact regions for providing electrical contact with the second gate electrode and of a width greater than the width of the second gate electrode that bridges each diffusion contact region of first type of electric conduction.

5. A semiconductor integrated circuit device as claimed in claim 4 wherein said first MOS transistor is symmetrical with respect to the transverse axis running through the center of said first region and wherein said second MOS transistor is symmetrical with respect to the transverse axis running through the center of said second region.

6. A semiconductor integrated circuit device as claimed in claim 5 wherein said first type of electric conduction is a p-type and said second type of electric conduction is an n-type.

7. A semiconductor integrated circuit device as claimed in any one of claims 4–6 wherein said plurality of basic cells are arranged such as to form a plurality of rows of basic cells.

8. A semiconductor integrated circuit device as claimed in claim 7 wherein said plurality of rows of basic cells include pairs of the adjacent two rows of basic cells, and wherein the arrangement of the MOS transistors in each cell in one of said adjacent two rows is interchanged with that of the MOS transistors of each basic cell in the other of said adjacent two rows with respect to the center line of the area sandwiched between said adjacent two rows.

9. A basic cell as claimed in claim 1 having a longitudinal cell axis common to both said first and second MOS transistors, each said MOS transistor region including a source/drain region, said diffusion contact regions of said second type of electric conduction including a pair of diffusion contact regions spacedly disposed along said cell axis on opposite respective sides of said source/drain region of said first MOS transistor, said diffusion contact regions of said first type of electric conduction including a pair of diffusion contact regions spacedly disposed along said cell axis on opposite respective sides of said source/drain region of said second MOS transistor.

10. A basic cell as claimed in claim 9 wherein the gate electrode contact regions of said first MOS transistor include two pairs of gate electrode contact regions, disposed spacedly along said cell axis, each pair disposed on opposite sides of each of said diffusion contact regions of said second type of electric conduction, the gate electrode contact regions of said second MOS transistor including two pairs of gate electrode contact regions disposed spacedly along said cell axis, each pair disposed on opposite sides of each of said diffusion contact regions of said first type of electric conduction.

11. A semiconductor integrated circuit device as claimed in claim 4, having a longitudinal cell axis common to both said first and second MOS transistors, each said MOS transistor region including a source/drain region, said diffusion contact regions of said second type of electric conduction including a pair of diffusion contact regions spacedly disposed along said cell axis on opposite respective sides of said source/drain region of said first MOS transistor, said diffusion contact regions of said first type of electric conduction including a pair of diffusion contact regions spacedly disposed along said cell axis on opposite respective sides of said source/drain region of said second MOS transistor.

12. A semiconductor integrated circuit device as claimed in claim 11 wherein the gate electrode contact regions of said first MOS transistor include two pairs of gate electrode contact regions, disposed spacedly along said cell axis, each pair disposed on opposite sides of each of said diffusion contact regions of said second type of electric conduction, the gate electrode contact regions of said second MOS transistor including two pairs of gate electrode contact regions disposed spacedly along said cell axis, each pair disposed on opposite sides of each of said diffusion contact regions of said first type of electric conduction.

* * * * *